(12) United States Patent
Weinberger et al.

(10) Patent No.: US 11,398,452 B2
(45) Date of Patent: Jul. 26, 2022

(54) ANODIC BONDING OF A SUBSTRATE OF GLASS HAVING CONTACT VIAS TO A SUBSTRATE OF SILICON

(71) Applicant: X-FAB Semiconductor Foundries GmbH, Erfurt (DE)

(72) Inventors: Stefan Weinberger, Itzehoe (DE); Roy Knechtel, Geraberg (DE); Peter Tilo, Itzehoe (DE)

(73) Assignee: X-FAB Semiconductor Foundries GmbH, Erfurt (DE)

( * ) Notice: Subject to any disclaimer, the term of this patent is extended or adjusted under 35 U.S.C. 154(b) by 0 days.

(21) Appl. No.: 16/653,149

(22) Filed: Oct. 15, 2019

(65) Prior Publication Data

US 2020/0118967 A1 Apr. 16, 2020

(30) Foreign Application Priority Data

Oct. 14, 2018 (DE) ...................... 10 2018 125 378.8

(51) Int. Cl.
| | |
|---|---|
| *H01L 21/00* | (2006.01) |
| *H01L 23/00* | (2006.01) |
| *H01L 23/14* | (2006.01) |
| *H01L 23/15* | (2006.01) |
| *H01L 23/498* | (2006.01) |

(52) U.S. Cl.
CPC ............ *H01L 24/83* (2013.01); *H01L 23/147* (2013.01); *H01L 23/15* (2013.01); *H01L 23/49827* (2013.01); *H01L 23/49894* (2013.01); *H01L 24/32* (2013.01); *H01L 2224/32225* (2013.01); *H01L 2224/32501* (2013.01); *H01L 2224/8302* (2013.01); *H01L 2224/83203* (2013.01); *H01L 2224/83893* (2013.01)

(58) Field of Classification Search
CPC ....... H01L 24/83; H01L 23/147; H01L 23/15; H01L 23/49827; H01L 23/49894; H01L 24/32; H01L 2224/32225; H01L 2224/8302; H01L 2224/83203; H01L 2224/83893

See application file for complete search history.

(56) References Cited

U.S. PATENT DOCUMENTS

2005/0285172 A1\* 12/2005 Freeman ................. H01L 24/26
257/296

\* cited by examiner

*Primary Examiner* — Richard A Booth
(74) *Attorney, Agent, or Firm* — Greenberg Traurig LLP

(57) ABSTRACT

Methods for the production of a semiconductor device are disclosed. In one embodiment, a method may include: (1) mechanically contacting a first substrate (100) having a semiconductor material to a second substrate (200) having a bondable passivation material and contact vias (210) extending through the bondable passivation material; (2) covering the contact vias (210) with an at least high-resistance material (220, 300) on a side facing away from the first substrate (100); (3) applying an electric potential between the at least high-resistance material and the first substrate. The potential has a sufficient level that is functionally sufficient to initiate a bonding process between the bondable passivation material of the second substrate and the semiconductor material of the first substrate.

37 Claims, 4 Drawing Sheets

ANODIC BONDING OF A SUBSTRATE OF GLASS HAVING CONTACT VIAS TO A SUBSTRATE OF SILICON

I. BACKGROUND OF THE INVENTION

1. Field of the Invention

This disclosure (as well as the claims) generally relates to the field of semiconductor production, especially to a large-area production of a passivating housing material on a wafer basis.

Preferably, through-contacts or vias are produced which are also referred to as TGVs (Through Glass Vias). Further preferred are substrates made of silicon and a glass material.

2. Description of the Related Art

In the production of semiconductor devices, small structural elements are produced in appropriate chip areas on a carrier material that typically comprises a semiconductor material, often in the form of silicon. After producing the corresponding device components, e.g. in the form of transistors, sensor elements or the like, it is usually required to provide these components with a protective housing so that a suitable passivation of the device components is carried out, however, without adversely affecting the function thereof. For this purpose, plastic materials are often provided that are suitably applied to or otherwise connected with the individual chip areas after separation thereof, wherein contacts are to be formed in an appropriate manner so that the corresponding unit that is composed of the semiconductor device including the numerous device components and the housing can be electrically or mechanically connected with further components, e.g. a printed circuit board or the like.

Due to the increasing miniaturization of and the growing requirements to semiconductor devices, techniques are increasingly employed in which at least regions of the respective chip areas are provided with a corresponding housing part that can also take over other functions. Advantageously, a large-area application of corresponding housing components can be accomplished with these techniques so that the corresponding process sequence can be performed on a wafer basis prior to separating the chip areas. For example, it is often required to provide appropriate covers of cavities including suitable sensor structures for semiconductor devices having integrated sensor components. For example, pressure sensors, acceleration sensors or the like can often be constructed on the basis of a cavity (in which a suitable gas or gas mixture having a suitable pressure is enclosed) created in the semiconductor material, to which cavity a cover is to be applied that enables passivation of the sensitive sensor components and contributes to the function of the sensor.

In many techniques, for example, glass, which is substantially composed of silicon dioxide and additional contents, in various forms has proved to be a suitable housing material for passivating semiconductor elements, since glass, due to its mechanical and thermal properties, for example, enables a tight and mechanically stable closure of cavities, well established processing methods are available for glass, and moreover no gas release takes place from and through the glass material. Thus, the semiconductor industry makes great efforts to apply a suitable glass material to already processed substrates including semiconductors on a wafer basis in a manner as efficient as possible.

In recent past a process technique has been employed for this purpose which is known as anodic bonding and is used for bonding a silicon wafer and a glass wafer, especially in MEMS- (microelectromechanical systems) technology, since anodic bonding leads to a high bonding strength, a hermetic closure, a highly parallel arrangement of the silicon wafer and the glass wafer, and a relatively straightforward and robust process behavior.

In the process of anodic bonding, the silicon wafer including the already produced device components and the glass wafer including a bondable glass material are suitably laid on top of each other and contacted by corresponding bonding electrodes so that a relatively high potential in a range of approx. 400V to 1,000V is created. In this case, the negative potential is applied to the glass wafer and the positive potential drops across the silicon wafer so that migration of sodium ions, which constitute one of the additional components of the glass material, within the glass wafer towards the electrode having the negative potential is caused while, on the other hand, oxygen ions migrate towards the silicon wafer and thus towards the interface between the glass wafer and the silicon wafer.

Under the influence of a temperature which is, for example, within a range of 300'C to 500° C., the glass material becomes sufficiently conductive so that a corresponding ion migration and thus a certain current flow through the glass material is possible.

An appropriate process sequence for bonding a glass wafer to a silicon wafer known in the field of semiconductor production is described with reference to FIGS. 1A and 1B.

FIG. 1A schematically shows a cross-sectional view of a bonding device 1 that is used for bonding a silicon wafer 100 and a glass wafer 200. The illustration in FIG. 1A is highly simplified in order to explain the principles of anodic bonding.

During the bonding process, a potential $H_V$ is created across a bottom plate as a first bonding plate 2 of the device 1 and the upper plate as a second bonding plate having the form of an electrode 3, which potential is typically within a range of 400V to 1000V, wherein the electrode 3 has the negative potential.

In the illustrated arrangement, for example, the bottom plate 2 is connected to ground, while the electrode 3 carries a negative potential. At the same time, a desired pressure and an appropriate temperature are employed in order to provide the preconditions for ion migration and thus the current flow within the glass wafer 200. The material of the glass substrate 200, which is a correspondingly suitable bondable material, contains appropriate ionic constituents in the form of sodium ions and oxygen ions that migrate correspondingly due to the heating of the composite of the wafer 100 and the wafer 200 and can thus cause a certain current flow due to the applied potential in the material of the glass wafer that has a very high resistance at room temperature. Due to the increasing accumulation of positive sodium ions in the region of the electrode 3, a depletion zone 203 is increasingly formed in the vicinity of an interface 204 between the materials of the wafer 200 and the silicon wafer 100.

On the other hand, negative ions in the form of oxygen ions increasingly migrate into the silicon material of the wafer 100 so that a high electric field is created in the vicinity of the interface 204 due to the depletion zone 203 and the migrating negative ions which causes a strong attraction between the two wafers 100, 200 in the area of the interface 204 on an atomic level. As a result, silicon-oxygen-silicon bonds are increasingly created in the interface 204, as shown in the enlarged view of the interface 204 on the right-hand side of FIG. 1A. Due to these created bonds, a very firm coupling is created between the two wafers 100 and 200 contributing to the above-mentioned advantages of anodic bonding.

In this way, housing components in the form of covers for the cavities or the like formed in the silicon wafer 100 can be deposited on a large area on a wafer basis by bonding the two wafers 100, 200.

Then, the further processing of the composite of the wafers 100, 200 can be continued. For example, the wafer 200, which is now firmly bonded to the wafer 100, can be ground to a desired thickness if the initial thickness of the wafer 200 that is required for the setting of certain process parameters of the bonding method is not suitable for the further processing. Then, contact vias or an appropriate connection pattern can also be produced on the wafer 100, for example, by suitably providing the silicon wafer 100, from the other side, with a passivating housing component which, if necessary, also provides the required terminals for the electrical connection of the semiconductor devices.

The above-illustrated good properties of the bond between a glass material and a semiconductor material, e.g. silicon, which can be obtained by anodic bonding further have led to suggestions, according to which also the further housing components are deposited in the form of a bondable glass material, wherein suitable contact vias would have to be provided in the respective housing components in order to create the electrical connections to the components within the silicon wafer 100.

For this purpose, the contact vias are produced in the form of a conductive material, e.g. in the form of silicon or a metal, within the glass wafer in such a manner that a contacting of corresponding device components on the semiconductor wafer is enabled. On the other hand, the corresponding contact vias for the connection of corresponding contact areas or other contacts are accessible form the opposite surface of the glass substrate. In this way, the favorable properties of anodic bonding can be utilized in order to deposit housing components provided with contacts on a wafer basis so that efficient contact schemes, e.g. flip-chip bonding, can be employed together with correspondingly suitably designed and deposited housing components having the suitable contact vias.

FIG. 1B schematically shows a cross-sectional view of the bonding device 1 that has already been schematically described in connection with FIG. 1A.

The device 1 comprises the upper bonding plate in the form of an electrode 3 and the lower bonding plate 2 between which the composite of the semiconductor wafer 100 and the glass wafer 200 is arranged. As explained above, the glass wafer 200 comprises corresponding through vias 210 which are also referred to as TGVs (Through Glass Vias).

It shows that, when using the conventional procedure that is highly efficient for glass substrates without contact vias and applies a high negative voltage between the bonding plate 3 and the bonding plate 2, stable process parameters cannot be determined for pressure and temperature as a function of the bonding voltage in order to accomplish a stable bonding behavior during processing.

The bonding voltage is dependent on temperature in that the lower the temperature is, the higher must be the bonding voltage. However, the pressure applied from the outside by the bonding plate is not dependent on the bonding voltage; the pressure is used only for bringing the wafers closer to each other. The operation can also be performed using a very low pressure. The two wafers are brought closer together on an atomic level as a result of the electrostatic force. Thereby Si—O—Si bonds are formed at the interface 204. Thus, the wafers 200 and 100 cannot be brought closer together on an atomic level in the interface 204 as a result of the electrostatic force between depletion zone 203 and the wafer 100 (see FIG. 1A).

The cause for stable process conditions not being established is to be seen in presence of contact vias 210 that provide a relatively low-resistance current path for the otherwise relatively high-resistance material of the glass wafer 200, as schematically indicated by 205 and R. As a result, the required conditions for a very high electric field between the glass wafer 200 and the silicon wafer 100 cannot be maintained or achieved to a sufficient extent. Thus, a reliable connection in the form of Si—O—Si bonds in the interface is not accomplished in this conventional arrangement, since a sufficient depletion zone and thus a sufficient internal electric field cannot be established, as distinguished from what is explained in connection with FIG. 1A.

US 2003/224559 A1 by Gross is concerned with anodic bonding of silicon wafers, denoted by 108, 110, 112, 114 therein, to glass wafers, denoted by 107, 109, 111 therein, as a passivation including contact vias 120. The glass can be an alkaline glass material, such as PYREX, which is considered to be adapted to silicon with respect to its thermal expansion, see especially paragraphs [76] to [80] thereof.

US 2017/232474 A1 by Oralkan et al is concerned with anodic bonding of thin silicon layers 102 of SOI substrates having thicker glass wafers 112 as a passivation, see FIGS. 1 and 2E and paragraph [49], which can be configured as TGVs, and comprising contact vias, as shown in FIGS. 3A to 3L and explained in paragraph [52].

EP 280 905 A2 by Hitachi shows, in FIG. 3 thereof, the interface between silicon and glass including $Na^+$ and $O^-$ with oxygen-silicon bonds as a consequence, see especially paragraphs [15] to [20].

DE 101 29 821 A1 by the applicant is concerned with anodic bonding of semiconductor wafers 2 with glass bodies 4 as a passivation including recesses 6 for bonding wires as contact vias.

SUMMARY OF THE INVENTION

With respect to the afore-mentioned situation of the prior art, a person skilled in the art will recognize a desire or demand to enable a reliable bond between glass substrates and substrates containing semiconductors with high process robustness.

The independent claims are incorporated by reference as embodiments herein.

A cover of the contact vias is provided on the "top side" of the glass substrate so that a high-resistance path for anodic bonding is present also in the region of the contact vias so that process parameters in the form of a high voltage, a temperature and a pressure can be selected in order to set reliable conditions for the bonding between the bondable glass material and the semiconductor material. Covering the contact vias can thus be performed such that, when an appropriate minimum voltage is applied between the glass substrate and the substrate (containing the semiconductor material), the developing current flow across the through via is so low that the suitable depletion layer is caused at the interface between the glass material and the semiconductor material as a result of ion movement ($Na^+$ and $O_2^-$), and thus the high internal electric field is generated which results in a firm connection on an atomic level, for example, in the form of Si—O—Si bonds.

The concept of covering the contact vias is so flexible that many different applications can be accounted for and that a substantially conventional arrangement of a bonding device can be used for bonding corresponding substrates to each other, if desired.

Appropriate voltages are preferably above 300V.

Anodically bondable glasses are normally alkaline. The alkali ions are able to move sufficiently from a certain temperature on. Thus, from a certain temperature on (bonding temperature, in most cases approx. 400° C.), the glasses are no longer a (pure) insulator. Herein, the term "at least high-resistance" is used that goes towards an insulator.

In some embodiments, the covering can be performed by means of a residual layer made of a bondable material of the glass substrate which is left in the production of the glass substrate including the contact vias in order to thus create at least one first high-resistance layer. Depending on the respective circumstances, this residual layer, which is thus a constituent of the glass substrate in the current production phase, can already be sufficient for achieving a high-resistance connection of the glass substrate with the semiconductor substrate.

As a result, the glass substrate can be contacted via the residual layer in order to apply the required potential. The contacting can be performed directly with the upper bonding plate or via "arbitrary suitable" means, e.g. a further additional layer made of a conductive material, by a further substrate suitable for contact with a high-voltage source. In some advantageous embodiments, the corresponding further substrate can also include an insulating material, e.g. a bondable glass material, in order to distribute the voltage drop over a greater distance in the insulating material. The high resistance can be increased. In this way, suitable process parameters can thus be determined efficiently, e.g. suitable temperatures and/or pressure relationships.

In other embodiment variants, the contacting of the residual layer of the glass substrate can be performed by using an electrode substrate, for example, in the form of a semiconductor material, e.g. silicon or the like, without any further essential processing steps being required.

In further embodiment variants, the glass substrate can be realized while maintaining a more or less conventional structure of the contact vias, which are thus accessible from the surface not to be bonded, by providing a suitable electrode substrate that is not intended for connection with the potential to be applied, but comprises suitable means for establishing the desired high-resistance state from the electrode of the bonding device to the contact vias of the glass substrate. For example, the electrode substrate itself can be provided as a bondable glass material, wherein a suitable electrode material, e.g. in the form of a metal layer, can be provided for contact with a voltage source. However, a metal layer is not mandatory; the electrode wafer can also be contacted all over by the upper bonding plate.

In further advantageous embodiment variants, a barrier layer can be provided at least on the contact vias in order to stop a diffusion behavior of the ion migration caused in the bonding process. For example, when the contact vias themselves comprise a bondable material, a permanent connection between the contact vias and the temporarily applied electrode substrate can be prevented by applying an appropriate diffusion-inhibiting layer (inhibiting oxygen ions).

The barrier layer can also be located all over the electrode wafer or glass substrate. The barrier layer should be located at least in the position of the contact vias on the side of the electrode wafer facing the glass substrate or on the glass substrate on the side facing the electrode wafer.

Other suitable layers for influencing the diffusion of, for example, sodium ions towards the electrode plates of the bonding device can also be provided in order to create appropriate conditions, e.g. avoiding Na contamination or the like.

It is also possible to provide a suitable contacting scheme for applying the required potential so that, for example, both the glass substrate and the semiconductor substrate are contacted by suitable electrodes of the bonding device from the same direction. For example, an electrode can be inserted through a recess in the glass substrate and in an electrode substrate, if provided, which electrode contacts the surface of the silicon substrate, while the glass substrate makes contact with a corresponding electrode of the bonding device arranged in a suitable position including a conductive material, i.e. above the glass substrate, e.g. in the form of an electrode substrate.

Advantageously, a structured metal layer can also be applied to the glass substrate, wherein said structure is formed such that there is no metal in the region of the through via. This (structured) metal layer can be contacted by, for example, the center pin. The glass substrate is provided with, for example, a recess via which the edge pin contacts the silicon wafer; alternatively the silicon wafer can also be contacted via the lower bonding plate.

The upper electrode or a specific electrode wafer can also be provided in which a recess or recesses are located. Said recesses are arranged above the through vias. Due to this recess or these recesses, the upper electrode or the electrode wafer does not contact the through vias and short circuits cannot occur. A bonding process is performed in this way. The lower semiconductor wafer is contacted by the lower bottom plate or the edge pin. When the edge pin and an electrode wafer are used, there is (only) one recess in the electrode wafer.

Alternatively, an electrode wafer having "insulating fences" is suggested. The "insulating fences" separate the potentials for the contacting of the glass and the contacting of the lower semiconductor wafer via the through via(s). This can be achieved by, for example, a glass-silicon-composite electrode wafer comprising at least silicon and "insulating fences" made of high-resistance glass.

The mentioned electrode wafer can be realized using the same technology as used with the afore-mentioned glass wafer including through vias. The electrical contacting of the electrode wafer is achieved by a structured metal layer on the backside of the wafer which is separated in an electrically insulating manner from other portions of the wafer in order to avoid short circuits, especially of a structured electrical insulating layer or an at least high-resistance barrier layer, e.g. made of $SiO_2$ or $Si_3N_4$.

The upper electrode can also be insulated in order to thus avoid a short circuit or current circuit between electrode and through via. The electrode wafer would be made of silicon carrying an insulating layer, e.g. containing silicon, made of $SiO_2$ or $Si_3N_4$ on the side facing the glass wafer. Then, the contacting of the silicon wafer can be performed either from the backside via the lower electrode or from the front side through a recess in the electrode wafer using the edge pin.

On the other hand, arrangements can be used for the bonding device in which the composite of the cover of the contact vias, e.g. in the form of a layer and/or a separate electrode substrate, the glass substrate and the semiconductor substrate is contacted from two different directions, e.g. from "above" and "below".

Further advantageous embodiment variants of the suggested anodic bonding of a glass substrate having contact vias and a substrate including a semiconductor material can be gathered from the dependent claims which are incorporated by reference herein.

BRIEF DESCRIPTION OF THE DRAWINGS

The embodiments of the invention are illustrated and not in a way that transfers or incorporates limitations from the Figures into the patent claims. Same reference numerals in the Figures denote similar elements. Features or properties of the following examples are not to be considered or understood as "essential to the claimed invention" unless explicitly stated otherwise. The claims have precedence and the examples explain or supplement them.

DETAILED EXPLANATION OF THE DRAWINGS

Figure 1A:
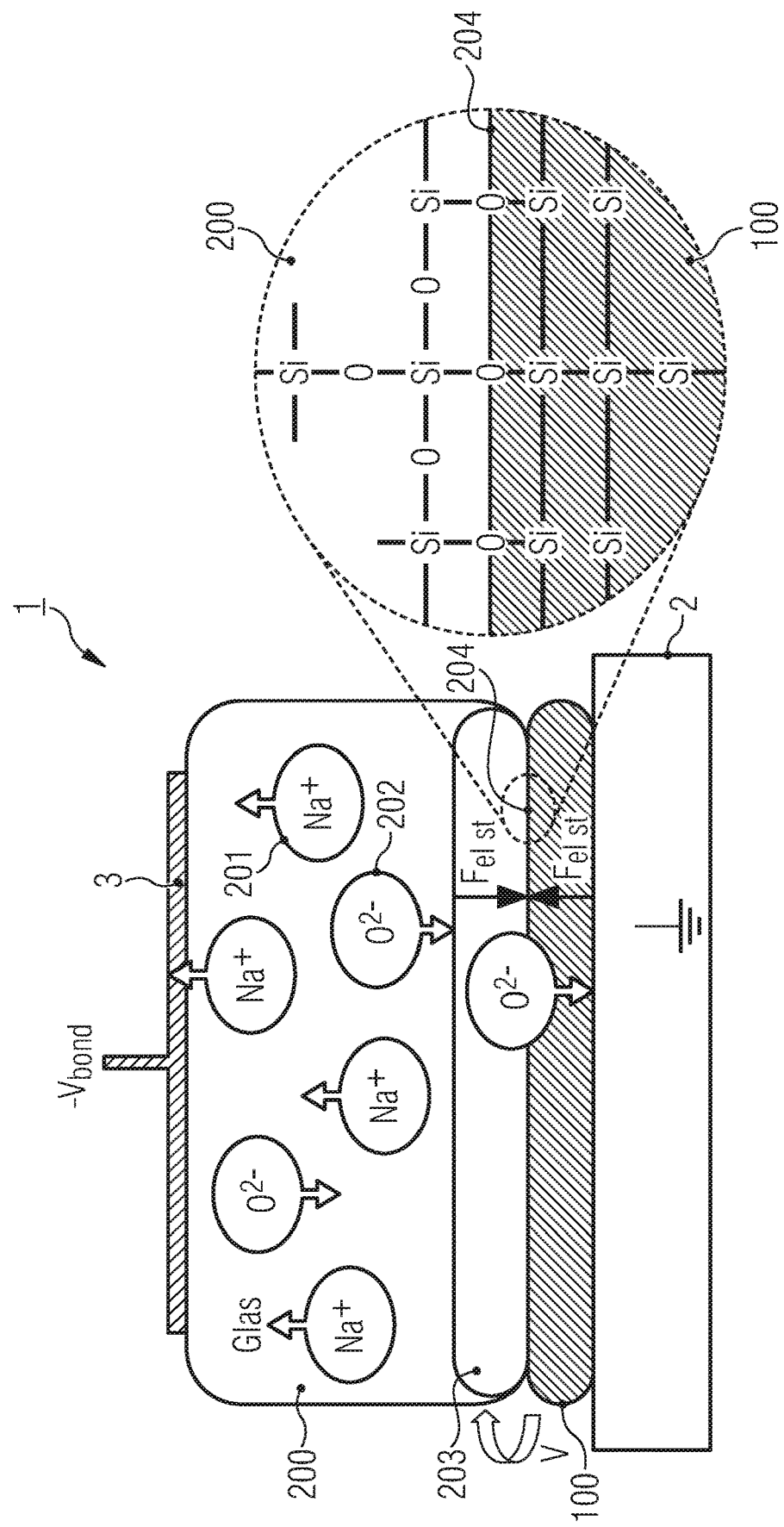
FIG. 1A is prior art and schematically shows a cross-sectional view of a bonding device 1 for anodically bonding a glass substrate 200 and a silicon wafer 100 using conventional techniques.
Figure 1B:
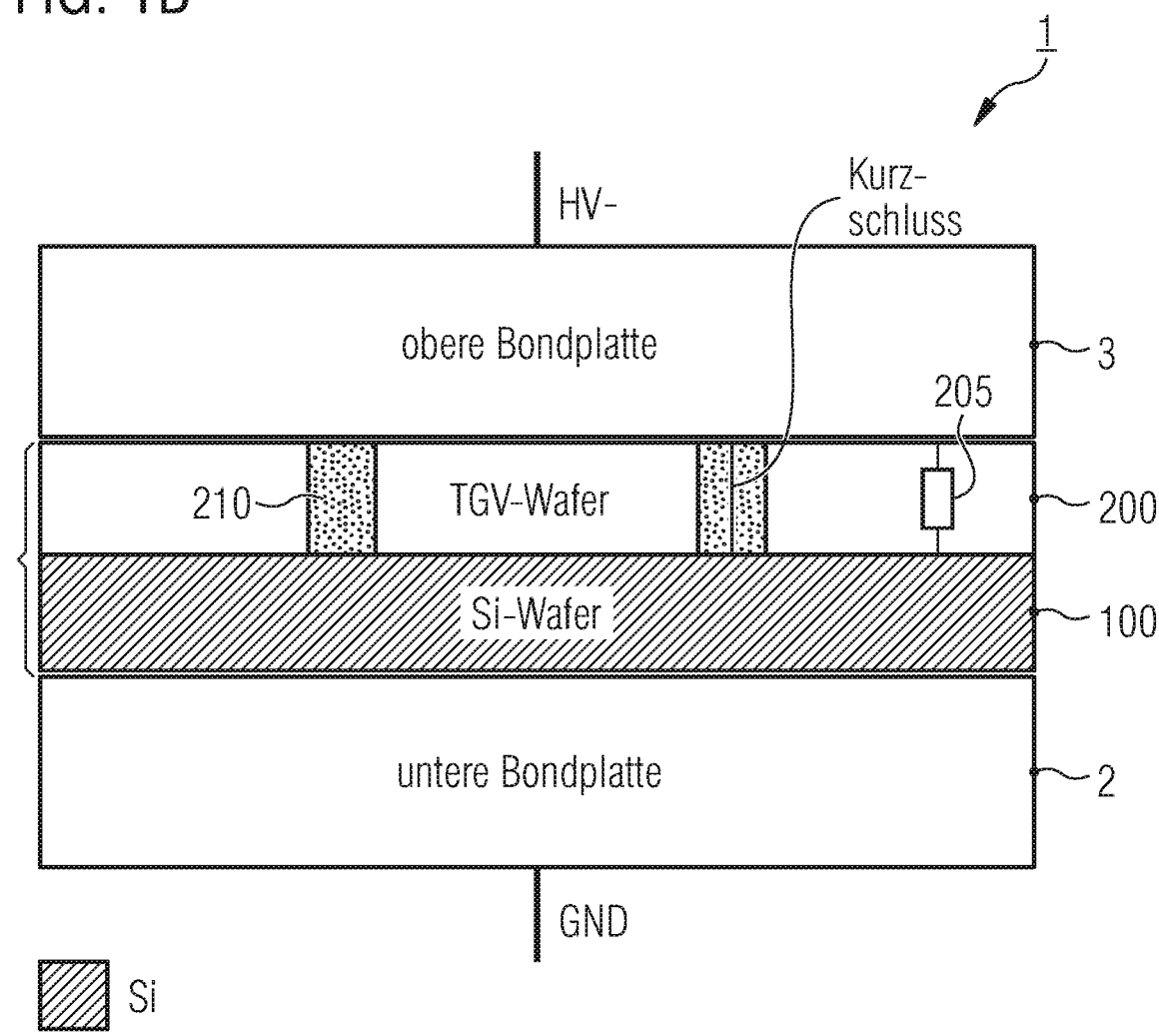
FIG. 1B is prior art and shows a schematic cross-sectional view of an arrangement in which a glass substrate 200 having contact vias 210 is to be connected with a silicon wafer 100, however, wherein the required conditions for reliable bonding are not achieved due to relatively low-resistance current paths (through the contact vias).
Figure 2:
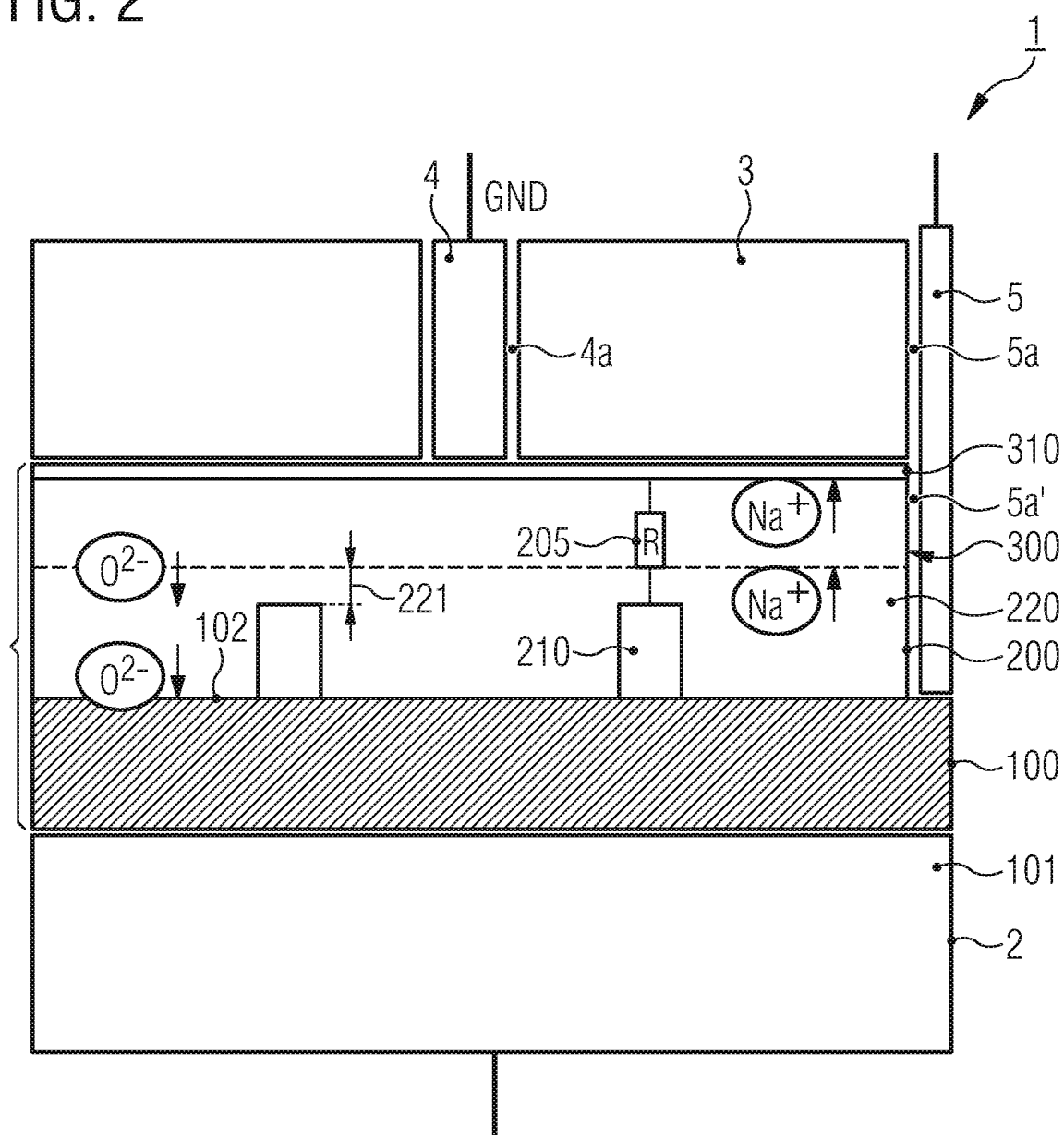
FIG. 2 is an example of the invention and schematically shows a cross-section of a composite of a glass substrate 200 having contact vias and a substrate 100 including a semiconductor material. Said substrates are to be connected in a bonding device, wherein the contact vias are covered, at least in part, by a layer provided on the glass substrate.
Figure 3:
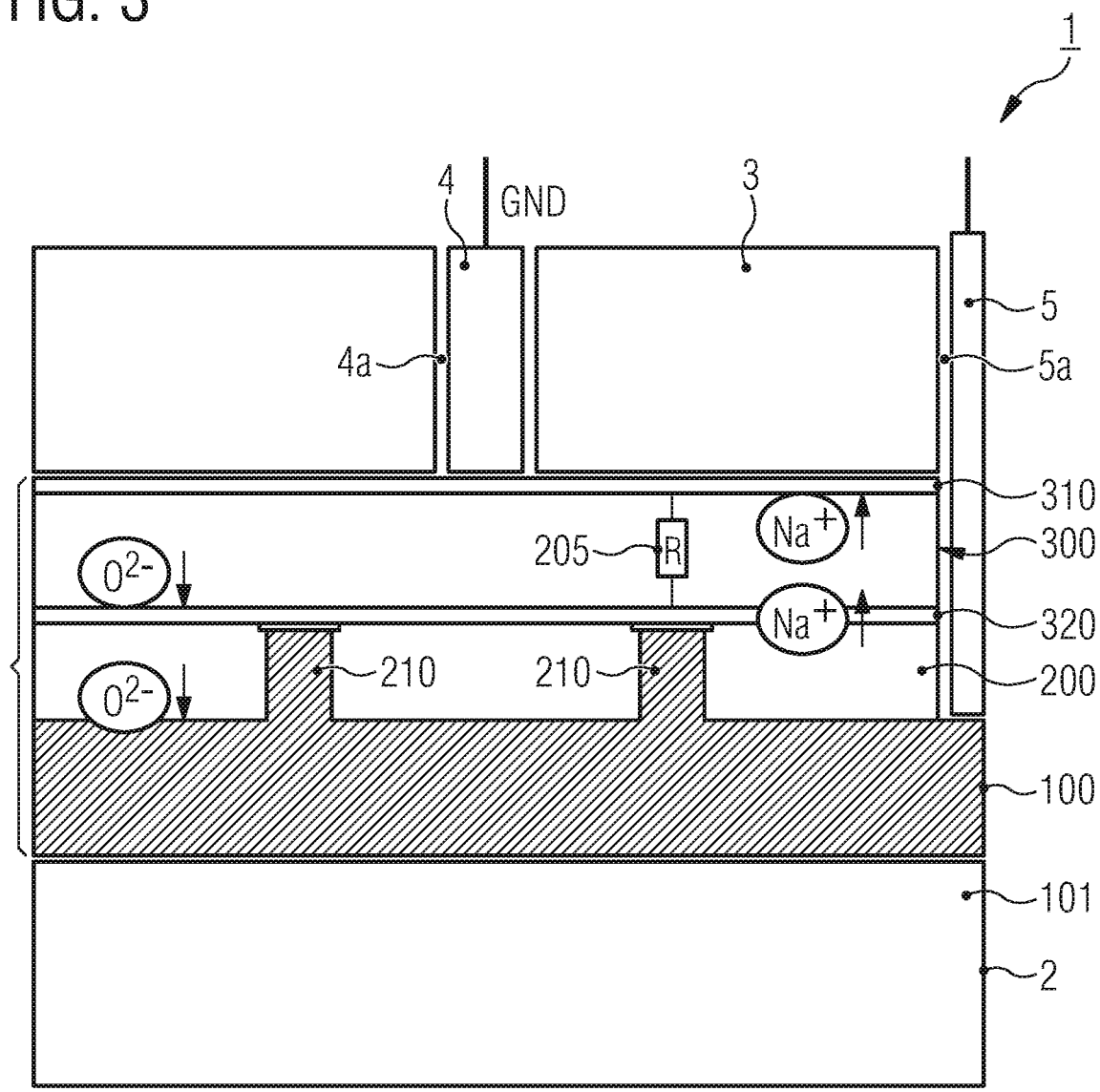
FIG. 3 is a further example of the invention and shows a view of a composite of a glass substrate having contact vias 210, an electrode substrate and a substrate including a semiconductor material in a bonding device, wherein the contact vias are covered by the electrode substrate.

The above disclosed concept for connecting a glass substrate having contact vias and a substrate including a semiconductor material on the basis of the anodic bonding method is now explained further with reference to FIGS. 2 and 3, wherein reference may also be made to prior art FIGS. 1A and 1B, if necessary.

FIG. 2 schematically shows a cross-sectional view of a composite of a substrate 100 that is, for example, a substrate including a semiconductor material, e.g. silicon, in which not shown device components are realized in the form of mechanical, and/or optical, and/or electrical sensor components, transistors, resistors or the like, wherein, in particularly advantageous embodiments, mechanical sensor components are provided, for example, in the form of cantilevers, membranes or the like, the deformation of which is used for evaluating corresponding physical quantities. As explained in the beginning, appropriate recesses or cavities to be suitably covered are often created in the substrate 100 for this purpose. For example, the substrate 100 can already comprise such a substrate that is provided on a "backside" 101 and is or has been connected with a starting material of the substrate 100, for example, subsequently or previously thereto, using the technique described above with reference to FIG. 1A.

As explained above, it is further advantageous to provide a housing component on a wafer basis, wherein a glass substrate 200 can be anodically bonded in which contact vias 210 are formed that are filled with any suitable conductive material, e.g. with silicon, a metal, a conductive barrier material/metal or the like.

By connecting the substrates 100 and 200, the housing components and electrical connections in the form of the contact vias 210 that make a connection with a surface 102 of the substrate 100 to be bonded on the one side and provide possible connections with further peripheral components on the other side which are also to be contacted in the substrate 200 on a wafer basis or after separating the corresponding chip areas. However, as opposed to the illustrations in FIGS. 1A and 1B, the contact vias 210 of the substrate 200 are covered by a suitable material so that a high-resistance path is created between the corresponding contact vias 210 and a contact point for the potential to be applied. This high-resistance path is schematically illustrated by 205.

In one embodiment variant, at least a part of the high-resistance path 205 is formed by a residual layer 220 that is formed on the substrate 200 above the respective contact vias 210. The residual layer 220 can be provided, for example, in the form of a bondable glass material having the same or at least very similar properties as the bondable glass material of the substrate 200 in which the contact vias 210 are embedded.

Examples of bondable glass materials include Borofloat33 by Schott, Pyrex 7740 by Corning, or SD2 by Hoya which combine low conductivity with temperature shock resistance.

In other embodiments, a different material can be used, provided that this material is compatible with the further conditions during the anodic bonding method to be performed.

In the illustrated embodiment, a thickness 221 of the residual layer 220 is set such that suitable parameter values for pressure and temperature as well as the voltage to be applied can be determined throughout the anodic bonding method.

Appropriate parameters can be determined, for example, by monitoring the current flow through the high-resistance path 205 for correspondingly selected further process parameters (at a constant voltage), e.g. pressure and temperature, so that, on the one hand, a selection of suitable parameters in the form of temperature and pressure can be performed, when using test substrates, on the basis of the path of the current that increases at the onset of ion migration and then decreases again when the width of the depletion zone (see FIG. 1A) increases as a consequence of the increasing lack of ions in the depletion zone. On the other hand, the current monitoring can also be performed during the actual process for product substrates as an endpoint control of the anodic process. For example, an appropriate analysis of the interface between the substrates 100 and 200 can be performed with respect to a suitable current path indicating a successful bonding of or between the substrates 100 and 200. A quality of the corresponding interface is determined and used for the selection of suitable process parameters.

In some embodiments, an electrode layer 310, e.g. in the form of aluminum or the like, which can be contacted by a suitable electrode 4 of the bonding device 1, is provided in order to improve the uniformity of the initial electric field across the substrate 200. At the same time, the electrode layer 310, which also serves the purpose of potential distribution, can further have a diffusion inhibiting-effect, for example, on sodium ions so that an adverse effect on the bonding plate 3 of the device 1 due to Na contamination can be significantly reduced at the onset of ion migration. For example, an aluminum layer having a thickness of several 100 nm can be efficiently used in order to obtain an effective potential distribution and a diffusion-inhibiting effect. The electrode layer 310 can be applied in the production of the residual layer 220 so that one or more additional deposition steps are performed in the production of the substrate 200 in order to temporarily apply the electrode layer or the potential-distribution layer 310 to the substrate 200.

In further advantageous embodiment variants, the contacting to the bonding device 1 can be performed by using an electrode substrate which is schematically denoted by 300 herein and is made of a conductive material and thus serves as an interface between the bonding plate 3 and the substrate 200 containing the residual layer 220. For example, a non-processed silicon wafer can be used as the electrode substrate 300 in order to thus enable a thermal, electrical and mechanical coupling of the substrate 200 to the bonding plate 3. In this embodiment variant, the thickness 221 of the layer 220 is selected such that it is sufficient for providing the high-resistance path 205, and the electrode substrate 300 is incorporated into the composite instead of or in addition to the electrode layer 310 and serves as a contact to the bonding plate 3.

In other embodiment variants, the electrode substrate 300 is provided in such a way that it forms a portion of the high-resistance path 205, as schematically indicated by the dashed line, so that the residual layer 220 serves the purpose of mechanically covering the contact vias 210 and provides the desired high resistance 205 only in cooperation with a further material of the electrode substrate 300.

For example, a bondable glass material is provided in the electrode substrate 300, which material can have, for example, similar or the same properties as the glass material of the substrate 200 and/or of the residual layer 220 on which the electrode layer 310 is provided, e.g. in the form of aluminum, in order to make contact with the electrode 4.

Dividing the high-resistance path 205 into the residual layer 220 and the electrode substrate 300 offers the advantage that the residual layer 220 contributes to a high mechanical robustness of the contact vias 210, but can be efficiently removed in the further course of the processing, i.e. after connecting the substrates 100 and 200, for example, by means of a simple grinding operation. On the other hand, the electrode substrate 300 can be reused in further bonding processes so that efficiency can be enhanced on the whole. The residual layer prevents bonding.

In further embodiment variants, the material of the electrode substrate 300 beneath the electrode layer 310 can be a different material exhibiting the required properties with respect to thermal robustness, electric strength or the like so that the high-resistance path 205 is provided without tending to make a bond with the contact vias 210, if the vias comprise a material which would otherwise tend to make a bond with glass, as is the case with silicon, aluminum or the like.

Also for this variant, i.e. the use of the electrode substrate 300 together with an insulating material providing the high-resistance path 205, suitable process parameters can be selected in connection with the electrode layer 310, as described above. In particular, an appropriate adjustment can be made on the side of the electrode substrate 300, e.g. when the residual layer 220 has the same thickness 221, wherein aspects of reusability of the electrode substrate 300 can also be taken into consideration when selecting suitable process parameters and a suitable structure of the electrode substrate 300.

When performing the anodic bonding process by means of the device 1, a potential is thus applied across the composite of the substrates 100 and 200 and, if provided, the substrate 300, wherein, for example, the electrode layer 310 and the substrate 100 serve as suitable conductive materials for connection to the corresponding electrodes. In this case, a conventional electrode arrangement can be chosen, as schematically shown, for example, in FIGS. 1A and 1B.

In the shown variant, the contacting of the composite is performed such that, for example, the electrode 4 is provided that makes contact with the electrode layer 310 in an appropriate position, whereas an electrode 5 of the bonding device 1 is arranged such that contacting of the surface 102 to be treated is possible.

However, the "center pin" 4 does not have to be used, rather the entire upper bonding plate 3 can be used as an electrode.

For example, the two live electrodes 4 and 5 (also referred to as center pin and edge pin) enable contacting of the substrate composite from the same direction, from above in FIG. 2. For this purpose, the bonding plate 3 as well as the substrate 200 and the electrode substrate 300, if provided, comprise a suitable recess 4a or 5a, for example, at the edge of the disk-shaped substrates so that the electrode 5 can be reliably moved past the substrates 300 and 200 while maintaining a sufficient safety distance. The bonding plates 3 and 2 exert a pressure in the above-mentioned way and heat the composite to a temperature so that, after applying the suitable voltage, the corresponding ion migration starts, the course of which can be monitored as described above in order to determine the end of the bonding process at the interface between the substrate 100 and the substrate 200 (see also FIG. 1A).

It should be noted that, in the shown arrangement of the bonding device 1, the electrode 4 is to be connected with the more negative potential in order to initiate the migration of the positive ions towards the electrode layer 310, whereas the more positive potential is to be connected with the electrode 5 in order to thus initiate migration of negative oxygen ions.

After completing the bonding of the substrates 200 and 100, semiconductor devices are thus created on a wafer basis that comprise the corresponding components in and/or on the substrate 100 together with corresponding housing components formed by the glass material substrate 200 together with the contact vias 210. The corresponding semiconductor devices thus also have an interface, for example, in accordance with the interface 204 of FIG. 1A, which includes corresponding Si—O—Si bonds when silicon is used as a semiconductor material for the substrate 100, whereby a firm connection with the housing substrate is obtained. The glass material of the substrate 200 is connected with the contact vias 210 in the region of the surface 102 belonging to a corresponding device component.

After successfully connecting the substrates 100 and 200, the process can be continued, for example, by removing the residual layer 220 which can be performed by grinding or the like. In this way, the contact vias 210 are exposed and can be used for further processes.

As explained above, a low thickness 221 of the residual layer 220 in this production phase has the advantage that the contact vias 210 can be exposed with relatively little effort, while the release of the electrode substrate 300 from the composite of substrates 100 and 200 can be performed mechanically in a simple manner, since a bond between the contact vias 210 and the material of the electrode substrate 300 is prevented, as described above.

FIG. 3 shows a schematic cross-sectional illustration, wherein a composite of the substrate 100 and the substrate 200 is to be bonded by means of the bonding device 1. In contrast to the embodiment illustrated in FIG. 2, the substrate 200 comprises the contact vias 210 in a form in which they would typically tend to make a bond with the glass material during an anodic bonding process. For example, the contact vias can be exposed in the glass substrate 200, as described above in the conventional method of FIG. 1B. In particular, contact surfaces in the form of aluminum surfaces on the contact vias 210 can already be provided so that a further processing at a later stage can be made more efficient.

In this embodiment variant, the glass substrate 200 is covered by the electrode substrate 300 comprising an insulating material, for example, in the form of a bondable glass material in order to create the required high resistance 205 between the electrode layer 310 that is connected with the electrode 4 and the respective contact vias 210. The insulating material of the electrode substrate 300 is chosen such that the high-resistance path 205 is obtained for a given set of parameters regarding voltage, pressure and temperature, as explained above.

In case there is no conductive path at all in the electrode wafer, a capacitive coupling can be incorporated. The electrode substrate (the electrode wafer 300) is not conductive and the electric field for anodic bonding is created by the capacitive coupling.

However, when using a bondable glass material for the electrode substrate 300, there is the risk of a bond of the glass material with the material of the contact vias 210, as explained above, especially when the vias are provided with an aluminum contact surface. A bonding to the through via or to pads on the through via may take place.

In order to prevent the undesired bonding, a barrier layer 320 is provided in the electrode substrate 300, which barrier layer is configured such that at least the diffusion of oxygen ions is stopped so that no or at least no noteworthy bonding of oxygen to the material of the contact vias 210 occurs. The barrier layer 320 can be applied in the form of any material that does not affect the high resistance of the path 205, but nevertheless allows a desired current flow and has the desired inhibitory effect on oxygen diffusion.

For example, silicon nitride is a material that, when having a thickness of some 100 nm to some μm, is suited to at least inhibit the diffusion of oxygen, while allowing a diffusion of positive sodium ions to a sufficient extent in order to thus create the conditions at the interface between the substrates 100 and 200, as explained above.

The silicon nitride is supposed to "actually" prevent the diffusion of oxygen only. In practice it also absorbs the sodium ions (sodium depletion), however, this does not affect the actual bonding process in an appreciable manner. Whether the Na$^+$ ions are stopped by the barrier layer on the electrode wafer or are able to diffuse therethrough, has no effect on the actual bonding process. The bonding process can then be performed in the same way as described above.

In the two embodiment variants of FIGS. 2 and 3, it can be achieved that an excessive sodium contamination of the glass substrate 200 on the top side thereof is prevented, for example, due to the fact that the diffusion takes place into the residual layer 220 and, if provided, possibly into the material of the electrode substrate 300 so that a corresponding desired high sodium concentration in the glass material of the substrate 200 is prevented after removal of the residual layer 220. On the other hand, the diffusion of sodium ions into the bonding plate 3 can be effectively suppressed by the layer 310 so that a longer reliability and consistency of the properties of the bonding plate 3 can be achieved.

The same applies to the embodiment variant of FIG. 3 in which, for example, the sodium ions diffuse into the electrode substrate 300 where their further diffusion into the bonding plate 3 is impeded by the layer 310. The possible enrichment of sodium in the material of the electrode substrate 300 can, for example, generally be taken into consideration from the start when constructing the substrate, e.g. in the form of the layer thickness of the glass material or the like so that the reuse rate can be correspondingly high even for the electrode substrate 300.

Respective glass substrates 200 can be produced, for example, by etching silicon substrates in such a manner that columns corresponding to the contact vias are left behind. A glass substrate is adhered to this etched surface by anodic bonding as is described, for example, in connection with FIG. 1A so that the glass substrate adheres to the columns of the silicon substrate. Subsequently thereto, the glass can be thermally treated in an appropriate manner so that it fills the interspaces of the silicon columns in a flowable manner, thereby reliably enclosing the columns and thus the vias by the glass material. When levelling the glass material that was flowably deformed before and removing excess material, a processing can be performed such that a desired residual layer, e.g. the layer 220, is maintained which meets the requirements made to the high-resistance path 205, as described above. When required, the layer 310 can be applied by known methods. In other variants, the properties of the residual layer 220 are supplemented by the additional electrode substrate 300, as described above in connection with FIG. 2.

Common methods can be used for producing the residual layer 220 so that the desired residual layer is left behind when the glass material is levelled after filling and enclosing the shaping silicon columns so that no substantial additional effort is created.

In the method described with reference to FIG. 2, the glass substrate can be produced in a conventional manner, without any further process steps being required.

On the other hand, the electrode substrate 300 of FIG. 3 can be produced in a simple manner by known depositing processes so that the effects on the entire process sequence are low owing to the reusability of the electrode substrate 300. All in all, the anodic bonding process for bonding the glass substrate to the contact vias exhibits high robustness and can thus be effectively used for the mass process.

A robust approach for anodic bonding of substrates having contact vias (or pads on the contact vias) is suggested, which substrates can be made of bondable materials, e.g. silicon, aluminum or the like. Owing to the reliable anodic bonding of the glass material having the contact vias, semiconductor devices can be provided with housing components on a wafer basis using a robust anodic bonding process so that a very firm bond, a high tightness and a high degree of parallelism of the bonded substrates with respect to each other is ensured, wherein the temperature stress during the bonding process is CMOS-compatible so that no limitations are required in the production of CMOS components on the semiconductor substrate. Thus, the properties of a glass material as a passivating housing material can also be fully utilized in conjunction with the contact vias on the basis of a robust bonding method, such as the transparency of the glass housing components in an optical inspection of the components after adding the housing components, and the good aptitude for high-frequency applications due to the dielectric properties of the glass material.

The invention claimed is:

1. A method for production of a semiconductor device, the method comprising:
   mechanically contacting a first substrate (100) having a semiconductor material to a second substrate (200) having a bondable passivation material and contact vias (210) extending through the bondable passivation material;
   covering the contact vias (210) with a resistance material (220, 300) on a side facing away from the first substrate (100);
   applying an electric potential between the resistance material and the first substrate;
   wherein the electric potential has a sufficient level that is functionally sufficient to initiate a bonding process between the bondable passivation material of the second substrate and the semiconductor material of the first substrate; and
   wherein an electrode wafer (300) is contacted with an upper electrode (3; 4), and a lower wafer, as a first substrate (100), is contacted with an edge pin (5) during the bonding process, wherein a ground connection, GND, is connected with the upper electrode and a positive voltage (+HV) is connected with the edge pin (5).

2. The method according to claim 1, wherein covering of the contact vias (210) is performed using an insulating material (220, 300) on the side facing away from the first substrate (100).

3. The method according to claim 1, wherein covering of the contact vias (210) comprises creating a layer made of the bondable passivation material above the contact vias (210) during the production of the second substrate (200).

4. The method according to claim 1, wherein covering of the contact vias comprises contacting an electrode substrate (300) to the second substrate (200) on the side facing away from the first substrate (100).

5. The method according to claim 3, wherein covering of the contact vias comprises contacting an electrode substrate to the second substrate on the side facing away from the first substrate.

6. The method according to claim 4, wherein the electrode substrate (300) comprises a conductive material.

7. The method according to claim 4, wherein the electrode substrate is not a conductive material, and an electrode wafer is provided that has a resistance.

8. The method according to claim 4, wherein the electrode substrate comprises an alkaline glass.

9. The method according to claim 8, wherein the electrode substrate comprises a borosilicate glass.

10. The method according to claim 1, wherein an electrode substrate, as an electrode wafer (300), is not conductive and an electric field for anodic bonding is established by a capacitive coupling.

11. The method according to claim 1, wherein an electrode substrate is highly conductive, and an insulating layer is applied thereto.

12. The method according to claim 11, wherein the electrode substrate is a doped silicon wafer, and the insulating layer is applied thereto.

13. The method according to claim 4, wherein properties of a layer made of the bondable passivation material are selected such that a resistance is created between the contact vias (210) and the electrode substrate (300).

14. The method according to claim 13, wherein the electrode substrate (300) comprises a potential compensation layer (310) made of a material containing metal on one surface thereof, said one surface facing away from the second substrate (200).

15. The method according to claim 14, wherein the potential compensation layer has a diffusion-inhibiting effect, at least on sodium ions.

16. The method according to claim 14, wherein the potential compensation layer (310) comprises aluminum.

17. The method according to claim 4, wherein the electrode substrate (300) is contacted with the second substrate (200) in such a manner that the electrode substrate is mechanically contacted with the contact vias (210) of the second substrate (200).

18. The method according to claim 1, comprising providing a barrier layer (320) at least on the contact vias (210) on the side facing away from the first substrate (100), said barrier layer inhibiting at least a diffusion of oxygen.

19. The method according to claim 18, wherein the barrier layer is created on an electrode layer prior to contacting an electrode substrate (300) to the second substrate (200).

20. The method according to claim 18, wherein the barrier layer is created on the second substrate (200) and bonded subsequently thereto.

21. The method according to claim 20, wherein the barrier layer is produced as a layer containing silicon and nitrogen.

22. The method according to claim 19, wherein the barrier layer is produced as a layer containing silicon and nitrogen.

23. The method according to claim 1, comprising heating the first and second substrates (100, 200), and exerting a pressure on a composite of the first and second substrates, while the electric potential is applied.

24. The method according to claim 1, wherein bonding electrodes are provided, and the electric potential is supplied by the bonding electrodes, wherein the bonding electrodes are guided to a composite of the first and second substrates from a common direction, especially for a wafer stack to be bonded consisting of at least three wafers.

25. The method according to claim 24, wherein the bonding electrodes are guided to the composite of the first and second substrates from a common direction for a wafer stack to be bonded consisting of at least three wafers.

26. The method according to claim 1, wherein only two wafers are to be bonded, and a silicon wafer is contacted from below.

27. The method according to claim 1, wherein the bondable passivation material becomes conductive under the influence of a first temperature enabling ion migration and, as a consequence thereof, an electrical current flow.

28. The method according to claim 27, wherein the bondable passivation material becomes conductive under the influence of the first temperature above a lower limit of at least 200° C. to enable ion migration, whereby an electrical current flow is enabled or takes place as a consequence thereof.

29. The method according to claim 27, wherein the bondable passivation material is a glass material.

30. The method according to claim 28, wherein the lower limit is within a range of 200° C. to 500° C.

31. The method according to claim 30, wherein the lower limit is within a range of 450° C. to 500° C.

32. The method according to claim 1, wherein there is a potential difference that is above 300V during the bonding process, wherein an electrode (3) carries a more negative potential so that Na⁺ ions move in this direction during the bonding process, which electrode is remote from the first substrate (100).

33. The method according to claim 32, wherein the potential difference existing during the bonding process is above 1,000 V.

34. The method according to claim 33, wherein the potential difference existing during the bonding process is above 2,000 V.

35. The method according to claim 32, wherein the potential difference existing during the bonding process is within a range of 300V to 2,000V.

36. The method according to claim 35, wherein the potential difference existing during the bonding process is within a range of 300V to 1,000V.

37. The method according to claim 1, wherein a lower electrode (2) is used for contacting an Si wafer, as a first substrate (100), during the bonding process, and a negative potential ($-H_V$) is applied to an upper electrode (3; 4) and a ground potential, GND, is applied to a lower electrode (2).

* * * * *